United States Patent
Chen (10) Patent No.: US 7,547,586 B2
(45) Date of Patent: Jun. 16, 2009

(54) METHOD OF MAKING A SELF ALIGNED ION IMPLANTED GATE AND GUARD RING STRUCTURE FOR USE IN A SIT

(75) Inventor: Li-Shu Chen, Ellicott City, MD (US)

(73) Assignee: Northrop Grumman Corp, Baltimore, MD (US)

( * ) Notice: Subject to any disclaimer, the term of this patent is extended or adjusted under 35 U.S.C. 154(b) by 544 days.

(21) Appl. No.: 11/445,215

(22) Filed: Jun. 2, 2006

(65) Prior Publication Data

US 2007/0281406 A1    Dec. 6, 2007

(51) Int. Cl.
*H01L 21/332* (2006.01)

(52) U.S. Cl. .......... 438/140; 257/42; 257/170; 257/484; 257/605; 257/E29.196

(58) Field of Classification Search ............... 438/140, 438/197; 257/E29.196, 42, 170, 484, 605
See application file for complete search history.

(56) References Cited

U.S. PATENT DOCUMENTS 5,528,058 A    6/1996    Pike, Jr. et al.
6,855,970 B2   2/2005    Hatakeyama et al.

OTHER PUBLICATIONS

Clarke et al., "30W VHF 6H-SiC Power Static Induction Transistor", Proceedings in IEEE Cornell Conference Advanced Concepts in High Speed Semiconductor Device and Circuits, 1995, pp. 47-55.*

Henning et al. "A Novel Self-Aligned Fabrication Process for Microwave Static Induction Transistors in Silicon Carbide", IEEE Electron Device Letters, vol. 21, No. 12, Dec. 2000, pp. 578-580.*

International Search Report issued Nov. 27, 2007 in counterpart foreign application in WIPO under application No. PCT/US07/12802.

* cited by examiner

*Primary Examiner*—W. David Coleman
*Assistant Examiner*—Sonya D McCall-Shepard
(74) *Attorney, Agent, or Firm*—Andrews Kurth LLP (57) ABSTRACT

A method of making a semiconductor structure for use in a static induction transistor. Three layers of a SiC material are on a substrate with the top layer covered with a thick oxide. A mask having a plurality of strips is deposited on the top of the oxide to protect the area underneath it, and an etch removes the oxide, the third layer and a small amount of the second layer, leaving a plurality of pillars. An oxidation step grows an oxide skirt around the base of each pillar and consumes the edge portions of the third layer under the oxide to form a source. An ion implantation forms gate regions between the skirts. At the same time, a plurality of guard rings is formed. Removal of all oxide results in a semiconductor structure to which source, gate and drain connections may be made to form a static induction transistor. A greater separation between a source and gate is obtained by placing a spacer layer on the sidewalls of the pillars, either before or after formation of the skirt.

9 Claims, 9 Drawing Sheets

METHOD OF MAKING A SELF ALIGNED ION IMPLANTED GATE AND GUARD RING STRUCTURE FOR USE IN A SIT

CROSS REFERENCE TO RELATED APPLICATION

This application is related to an application entitled "A SEMICONDUCTOR STRUCTURE FOR USE IN A STATIC INDUCTION TRANSISTOR HAVING IMPROVED GATE-TO-DRAIN BREAKDOWN VOLTAGE", filed on Jun. 1, 2006, Ser. No. 11/444,497. This application is assigned to the assignee of the present invention and is intended to be incorporated herein by reference for any and all purposes.

BACKGROUND OF THE INVENTION

1. Field of the Invention

The invention in general relates to semiconductors, and more particularly to a silicon carbide static induction transistor capable of high temperature, high frequency, high power operation.

2. Description of Related Art

A typical SIT (static induction transistor) is a vertical structure semiconductor device wherein electrical current flows from a plurality of source regions to a drain region, on opposite sides of a substrate member. Current flowing from source to drain is controlled by a potential barrier induced by gate regions positioned between the sources. The region between the source and gates is known as the channel region, while the region between the bottom of the channel region and drain is known as the drift region.

One popular type of SIT is the Schottky gate SIT wherein the gates are metal areas applied directly to the semiconductor body in an alternate arrangement with the sources. Problems with such Schottky gate SITs include inconsistent gate fabrication, reliability, and general difficulties in the manufacturing process.

Another type of popular SIT is the ion implanted gate SIT. Problems arising in the manufacturing process for these SITs include imprecise spacing of the gate to source, erratic breakdown of the gate to source and the requirement of multiple masks. These masks must be 100% precisely aligned, which is not always the case, particularly when hundreds of SITs are simultaneously fabricated on the same semiconductor wafer.

It is an object of the present invention to provide a fabrication process for a SIT which eliminates the problems associated with prior art SITs.

SUMMARY OF THE INVENTION

A method of making a self aligned ion implanted gate and guard rings structure for use in a static induction transistor is described and includes providing a semiconductor body with a plurality of epitaxially grown layers of a first conductivity type on a substrate, with a top one of the layers having a dopant concentration greater than that the next adjacent layer. A thick oxide arrangement is formed on the top of the top layer. A metallic mask having a plurality of strips is deposited on the top of the oxide arrangement, with the strips being parallel to one another. The oxide arrangement which is between the strips is etched down to the next adjacent semiconductor layer to form an array of parallel pillars each having at the base thereof, the remainder of the top layer after the etching step. The mask is then removed. The resulting structure is subjected to an oxidation process to grow an oxide skirt around the base of the pillar and to consume the edges of the remainder of the top layer. The resulting structure is then subjected to an ion implantation to form gate regions of a second conductivity type between the oxide skirts. Any remaining oxide is removed to form a structure to which electrical contacts may be made to each remainder of the top layer, each defining a source, to the gate regions and to the substrate, forming a drain. A plurality of ion implanted guard rings surrounding the array of pillars may also be formed simultaneously with the gate regions.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

Similar reference characters refer to similar parts throughout the several Figs.

DESCRIPTION OF THE PREFERRED EMBODIMENT

Although the invention is applicable to various semiconductor materials it will be described, by way of example with respect to a semiconductor structure utilizing SiC (silicon carbide). SiC is a preferred material over, for example Silicon, since SiC exhibits higher breakdown voltage, lower thermal impedance due to superior thermal conductivity, higher frequency performance, higher maximum current, higher operating temperature, and improved reliability, particularly in harsh environments.

Figure 1:
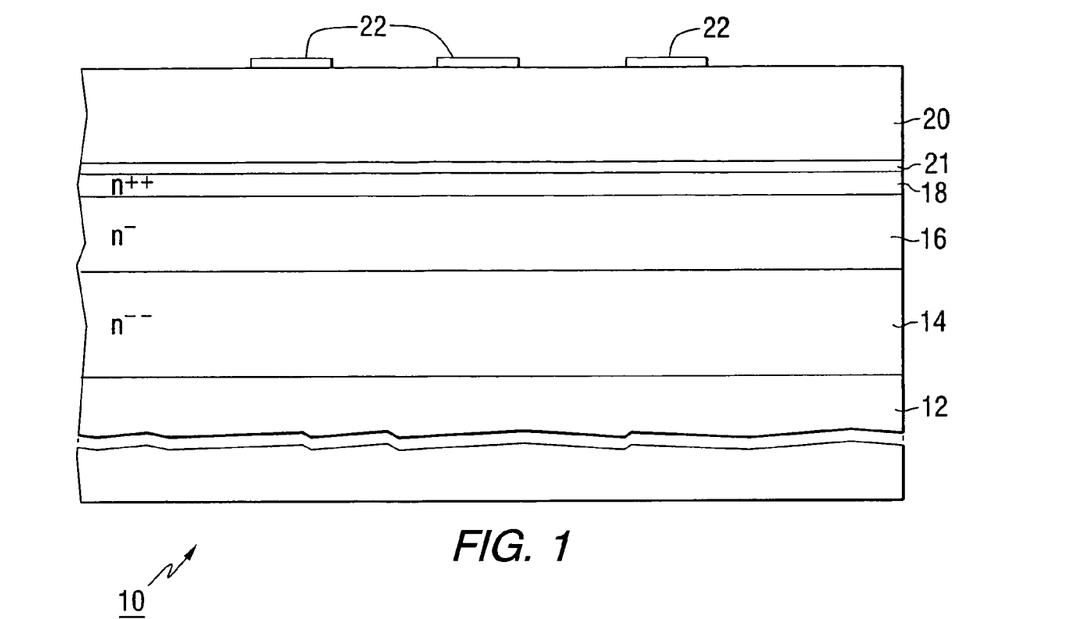
FIG. 1 is a cross-sectional view of a semiconductor body as one step in the fabrication process, in accordance with the present invention.

In FIG. 1, the semiconductor body 10 includes a SiC substrate member 12, upon which is disposed a plurality of SiC epitaxial layers. In accordance with one embodiment, the layer which defines the drift layer will have a different dopant concentration than the layer which contains the channel region. Accordingly, the body 10 of FIG. 1 includes a first layer 14, of an $n^{--}$ dopant concentration, a second layer 16 of an n⁻ dopant concentration, and a third layer 18 of an n⁺⁺ dopant concentration, which will form the source members in the finished product.

Figure 1A:
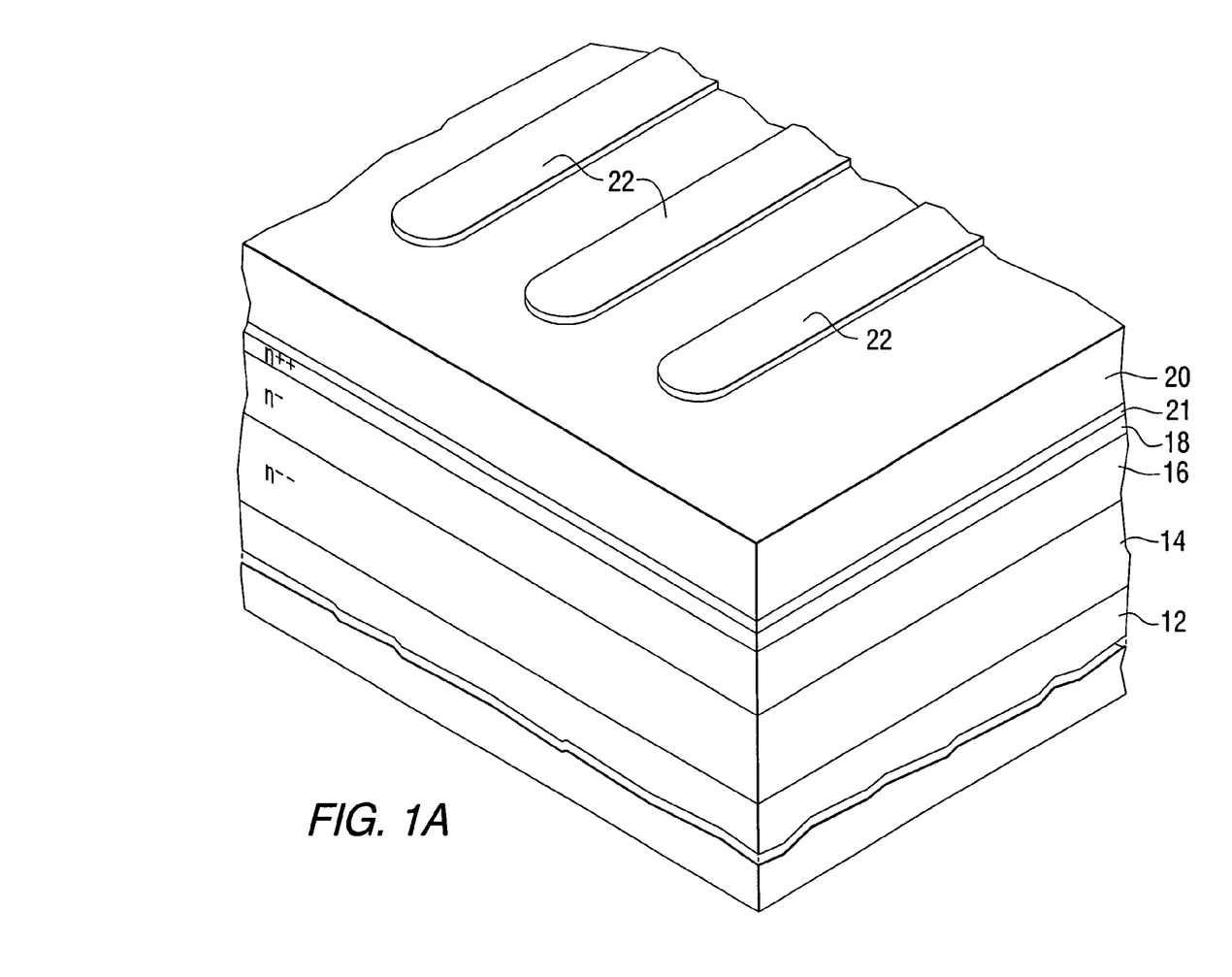
FIG. 1A is an isometric view of FIG. 1.

The layers of epitaxial material are covered with a thick oxide layer such as TEOS (tetraethyl orthosilicate) 20 which may be applied by a CVD (chemical vapor deposition) process. In order to ensure good adhesion of the oxide layer 20, a thin oxide layer 21 is thermally grown on layer 18 so that oxide layer 20 firmly bonds with oxide layer 21. A mask having a plurality of strips 22, of a metal composition such as chromium/nickel, is deposited on top of oxide layer 20 in a manner that the strips 22 are parallel to one another and extend into the plane of the Fig. An isometric view of this is illustrated in FIG. 1A. In a typical structure, hundreds of such strips 22 may be provided for one semiconductor body.

Figure 2:
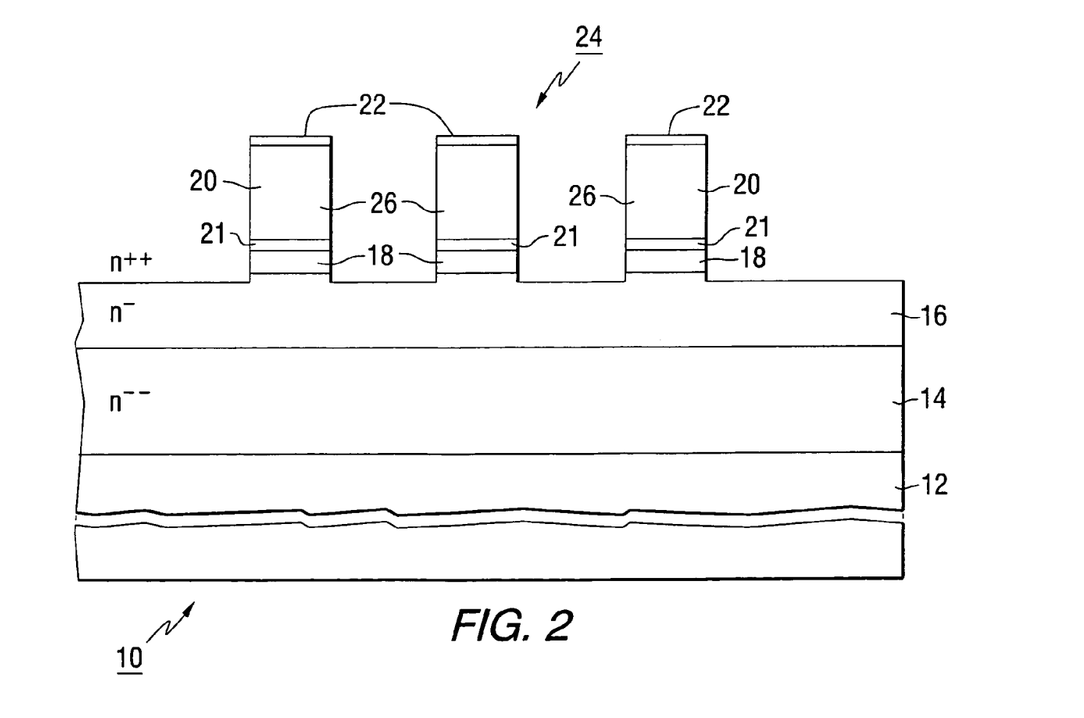
FIG. 2 illustrates the body after an RIE process.
Figure 2A:
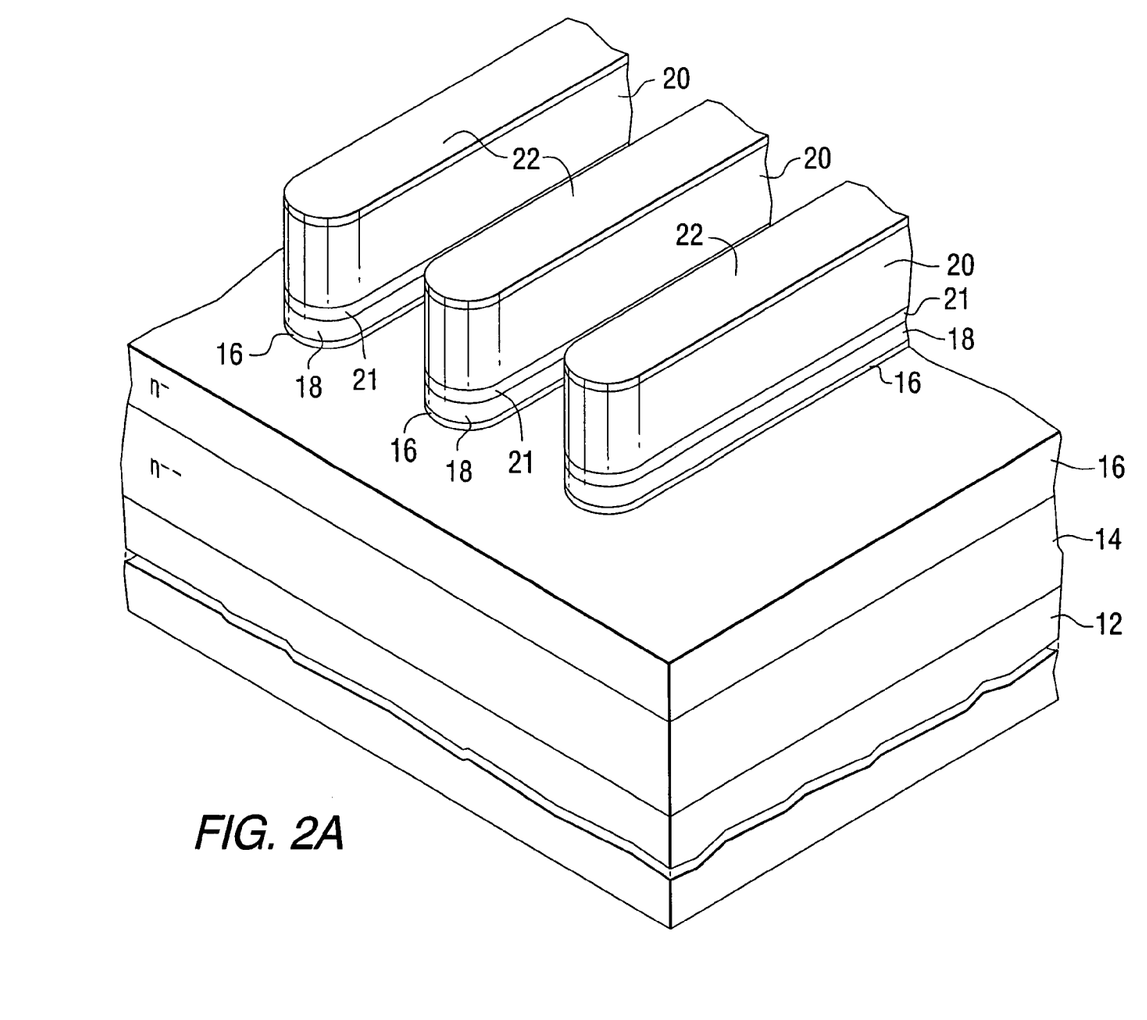
FIG. 2A is an isometric view of FIG. 2.

The body 10 is subjected to a RIE (reactive ion etch) to remove all of the oxide 20, except that under the strips 22. The result of the RIE is illustrated in FIG. 2. The depth of the etching is such that a very small portion of layer 16 is also removed. The etching yields an array 24 of parallel pillars 26 which extend into the plane of the Fig. An isometric view of the result is illustrated in FIG. 2A. Prior to further processing the metal strips 22 are removed.

Figure 3:
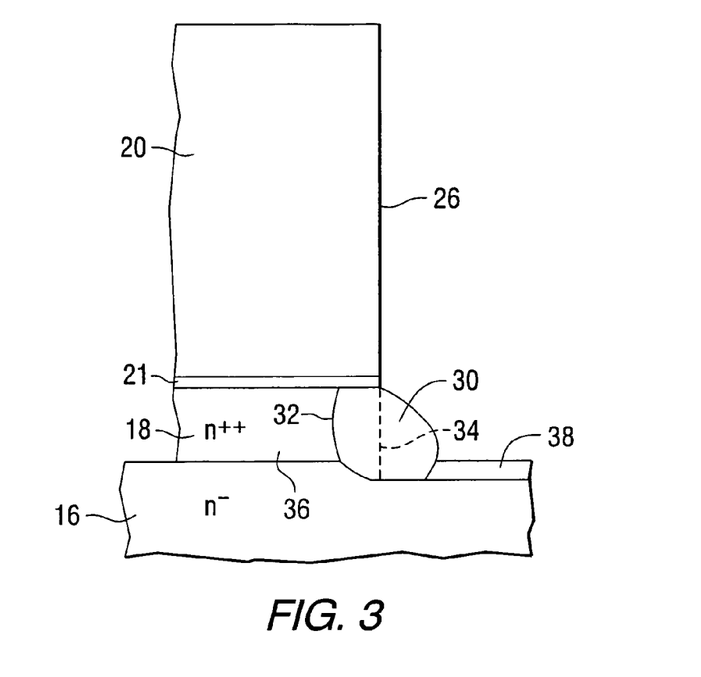
FIG. 3 illustrates an oxide skirt at the base of a pillar.

Oxide skirts are next grown around the base of the pillars 26. This is illustrated in FIG. 3, which shows a portion of a pillar 26. The body 10 is subjected to an oxidation in an oxidation furnace. The oxygen reacts with the SiC of the layer 18 at the base of the pillar 26 to form silicon dioxide and carbon dioxide. The result is to grow an oxide skirt 30 at the base of pillar 26 which extends into the valley between adjacent pillars.

Figure 4:
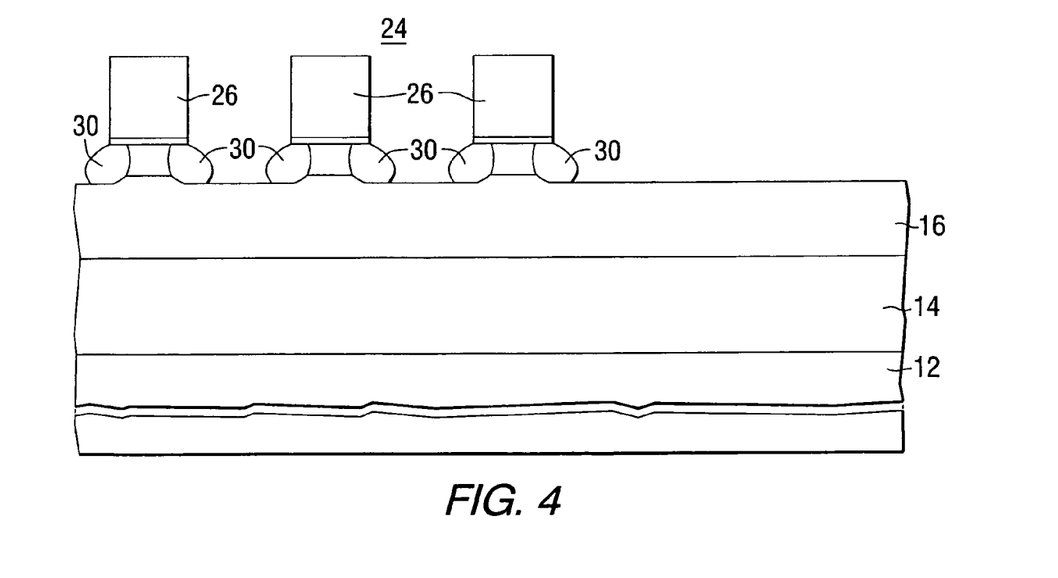
FIGS. 4 to 7 illustrate further steps in the process.

Since SiC is consumed in the process, layer 18 effectively shrinks to the position represented by line 32 which is spaced from its original position, represented by dotted line 34. The remaining SiC then defines the source 36 of the SIT. The oxidation process also forms an oxide layer 38 on layer 16. Since the oxidation process is more rapid in the horizontal direction than the vertical direction, this oxide layer 38 is very thin and may be removed by RIE. FIG. 4 illustrates the array 24 of pillars 26 with oxide skirts 30 and with oxide layer 38 removed.

Figure 5:
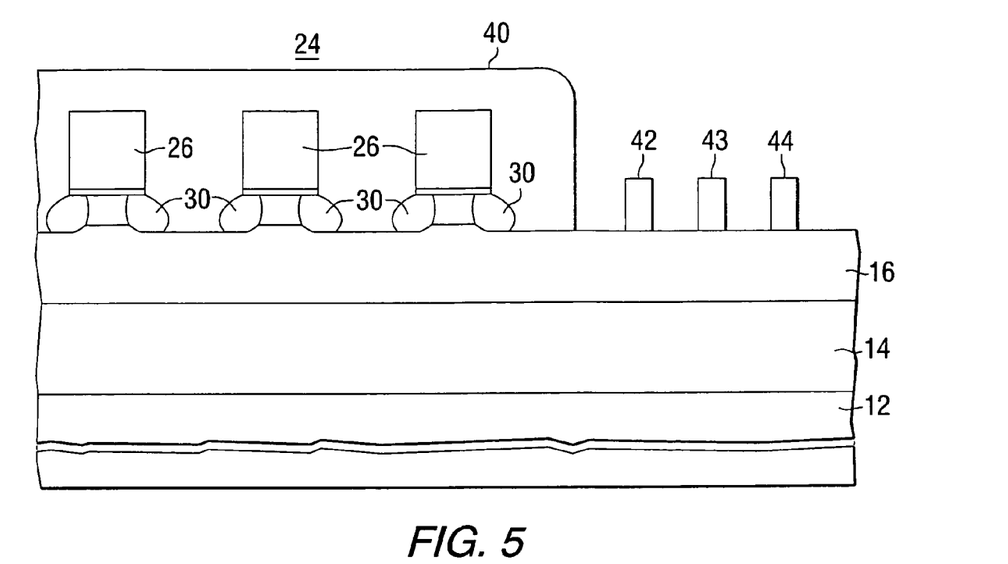
Figure 6:
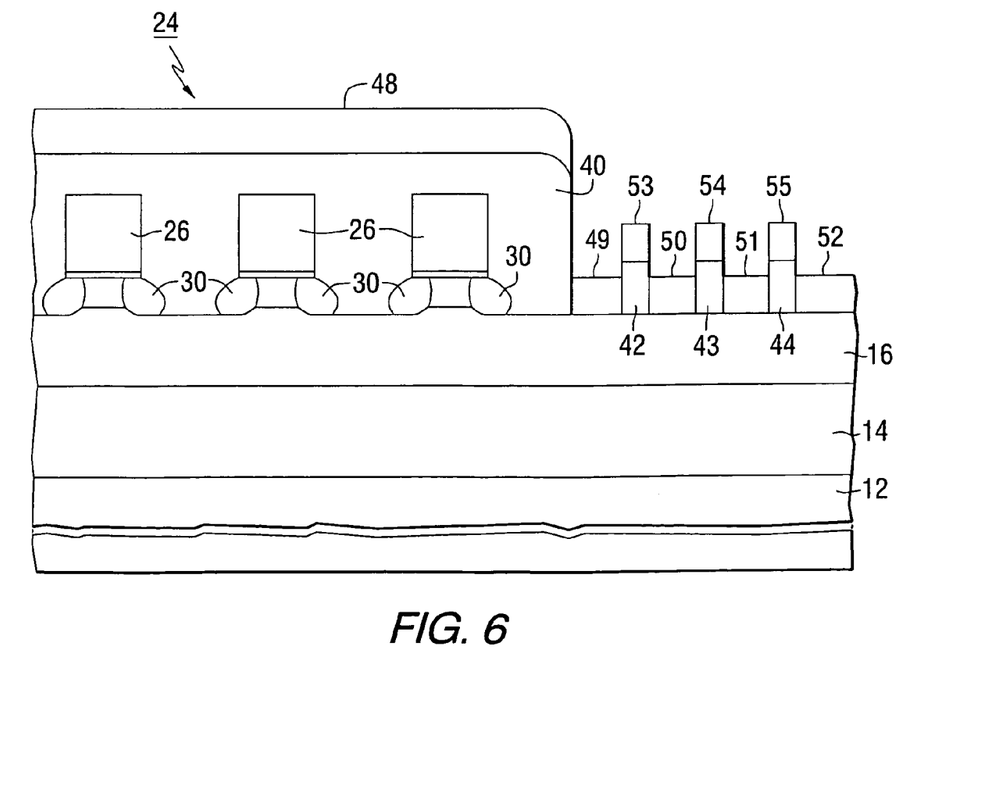

As indicated in FIG. 5, the next step involves a masking process whereby a photoresist 40 is applied over the array 24 of pillars 26. Also formed by the masking process are a plurality of concentric rings 42, 43 and 44 of the photoresist which surround the array 24. A silicon monoxide layer 48 is then applied, as illustrated in FIG. 6, to cover the photoresist 40 which is over the array 24. In addition the silicon monoxide deposits on layer 16 as rings 49, 50, 51 and end section 52, as well as over rings 42, 43 and 44 the latter deposits being indicated by numerals 53, 54 and 55.

The photoresists 40, 42, 43 and 44 are then dissolved by a photoresist strip solvent. In the process, the dissolving photoresist also lifts off any silicon monoxide which is deposited on it thereby leaving the exposed pillars 26 and carbon monoxide concentric rings 49, 50, 51 and end section 52 on layer 16, as illustrated in FIG. 7 and in the isometric view of FIG. 7A.

Figure 7:
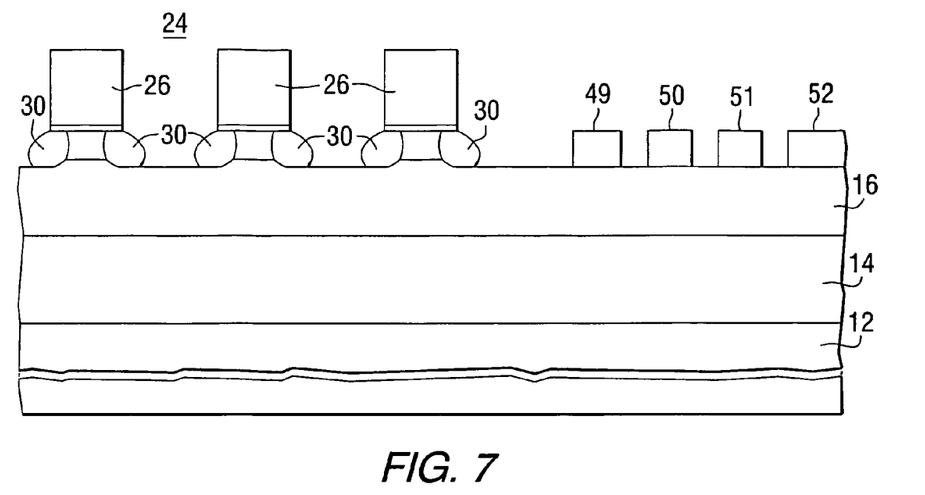
Figure 7A:
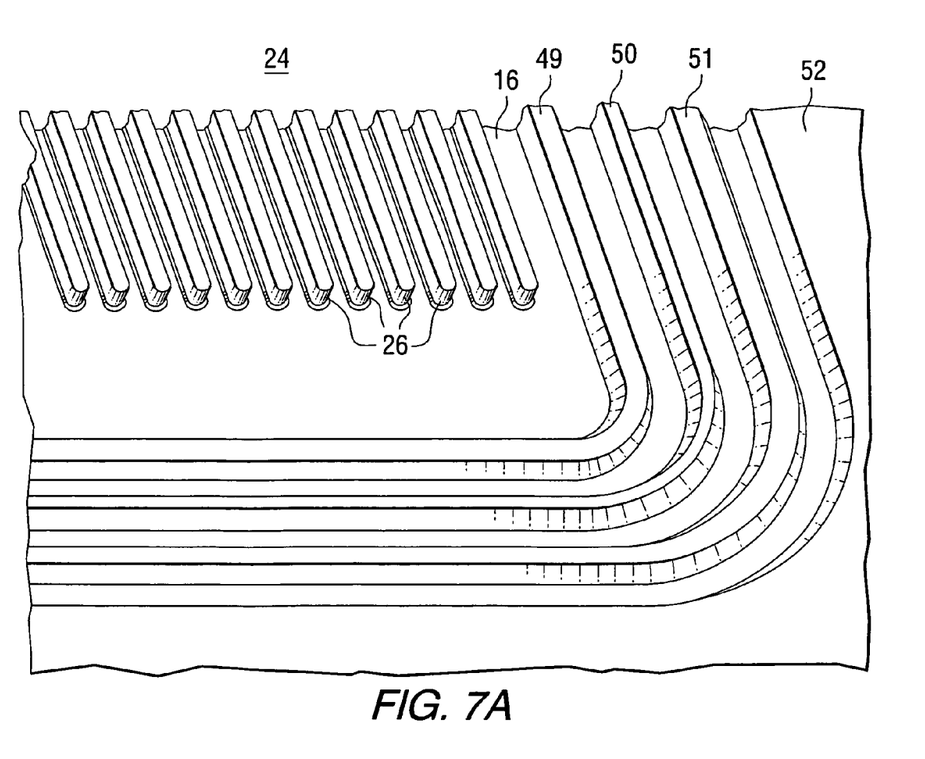
FIG. 7A is an isometric view of FIG. 7.
Figure 8:
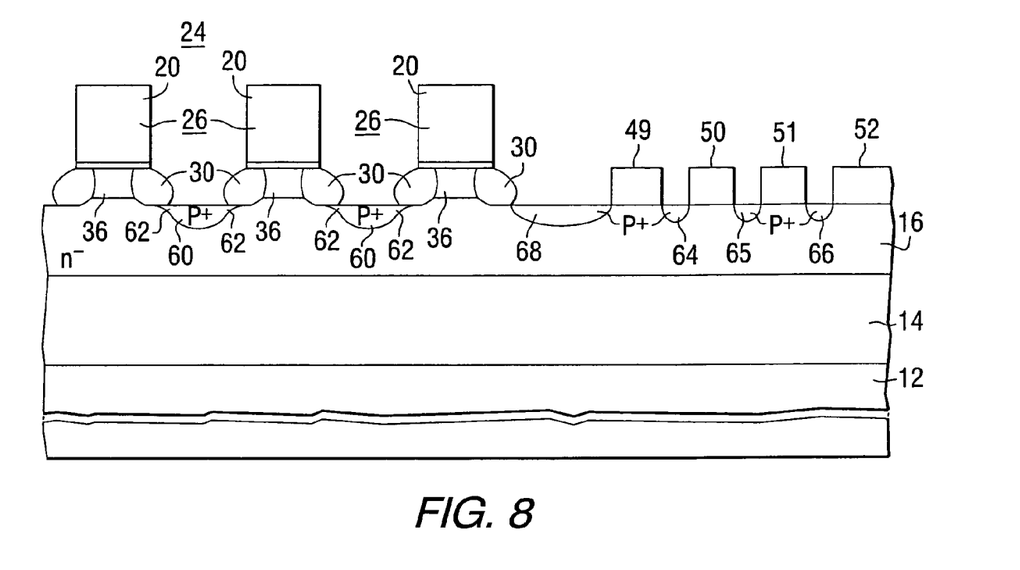
FIGS. 8 and 9 illustrate two further steps in the process.

The structure of FIG. 7 is then ready for gate formation by ion implantation using, for example, boron, aluminum, or a combination of the two, as illustrated in FIG. 8. Ion implantation of p⁺ gates 60 is accomplished without the requirement for any masking operation, thus eliminating any potential for misalignment. Skirts 30 ensure that the implanting ions are confined to the space between adjacent skirts 30. This fabrication results in an enhancement of the gate-to-source breakdown voltage as well as a reduction of the gate-to-source leakage current.

Ions also penetrate skirts 30, however the ions are retarded by that oxide such that implanted p⁺ areas 62 of gates 60 are shallow and miniscule. Ions also penetrate into the thick oxide layer 20 but fail to penetrate down into the sources 36 due to the thickness of the oxide layer 20.

Implanted simultaneously with the gates 60 are a plurality of concentric p⁺ guard rings 64, 65 and 66, three being illustrated by way of example. These guard rings surround the array 24 of pillars 26 and are implanted without the requirement for masks by virtue of silicon monoxide depositions 49, 50, 51 and 52 which confine the ion implantation of the guard rings to the areas illustrated. The guard rings 64, 65 and 66 reduce the electric field concentration at the edge of the gate region and enhance the breakdown voltage of the device. Ion implant area 68 surrounds the array 24 and electrically connects all of the gates together. This simultaneous implantation of gates and guard rings proves to be effective to increase the gate-to-drain voltage breakdown. The number of guard rings and their related width and spacing are optimizes to achieve a desired gate-to-drain breakdown voltage.

The ion implant step tends to degrade the SiC crystal structure. Therefore, after the ion implantation, an annealing process is performed to undo the deleterious effects of the ion implantation.

Figure 9:
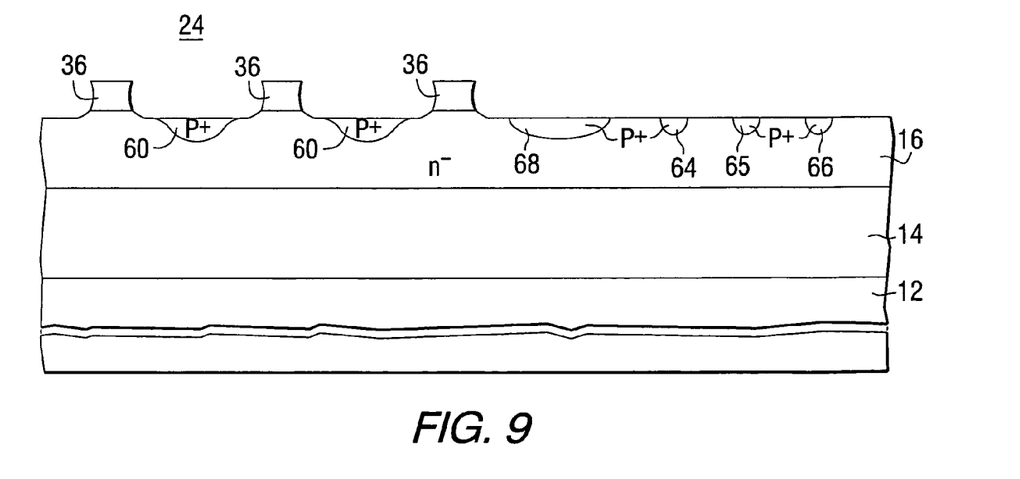

The last process step, as illustrated in FIG. 9, removes all of the oxides remaining, leaving a structure for use in a SIT, and to which electrical connections may be made, by means well known to those skilled in the art, to the sources 36, to the gates 60 and to the substrate 12, which forms the drain.

Figure 10:
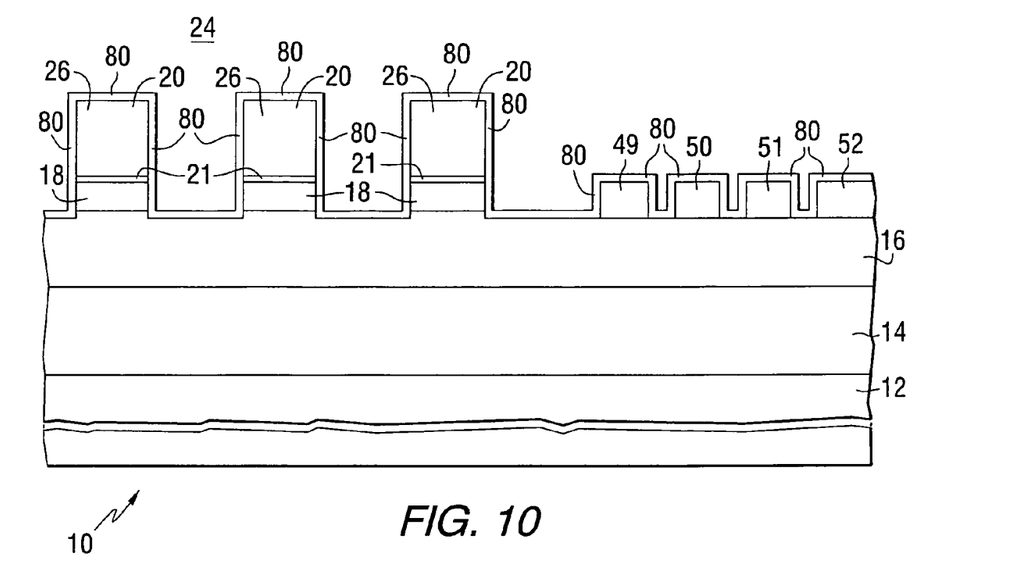
FIG. 10 illustrates the body after deposition of a spacer layer.
Figure 11:
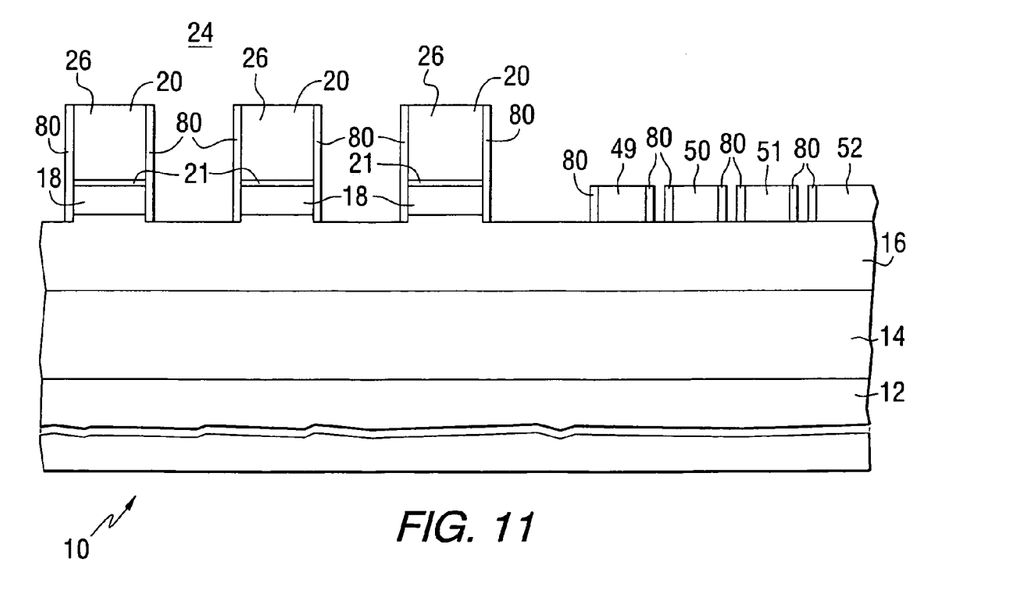
FIG. 11 illustrates the body after removal of the spacer layer of FIG. 10.

FIG. 9 illustrates the separation between a source 36 and a gate 60. An even greater separation may be achieved by the process illustrated in FIGS. 10 and 11. As illustrated in FIG. 10, a spacer layer 80 of TEOS, for example, is deposited on top of the elements of body 10. The body is then subjected to an RIE to remove the TEOS on top of the pillars 26 and on the surface of semiconductor layer 16, leaving the structure illustrated in FIG. 11.

This structure is placed in the aforementioned oxygen furnace whereby the oxide skirts are grown, as previously described. Due to the added thickness of the spacer layer 80, the implanted gate will be narrower than that illustrated in FIG. 9, and accordingly, spaced further from a source element providing for a greater source-to-gate breakdown voltage capability, as well as its related leakage current.

Figure 12:
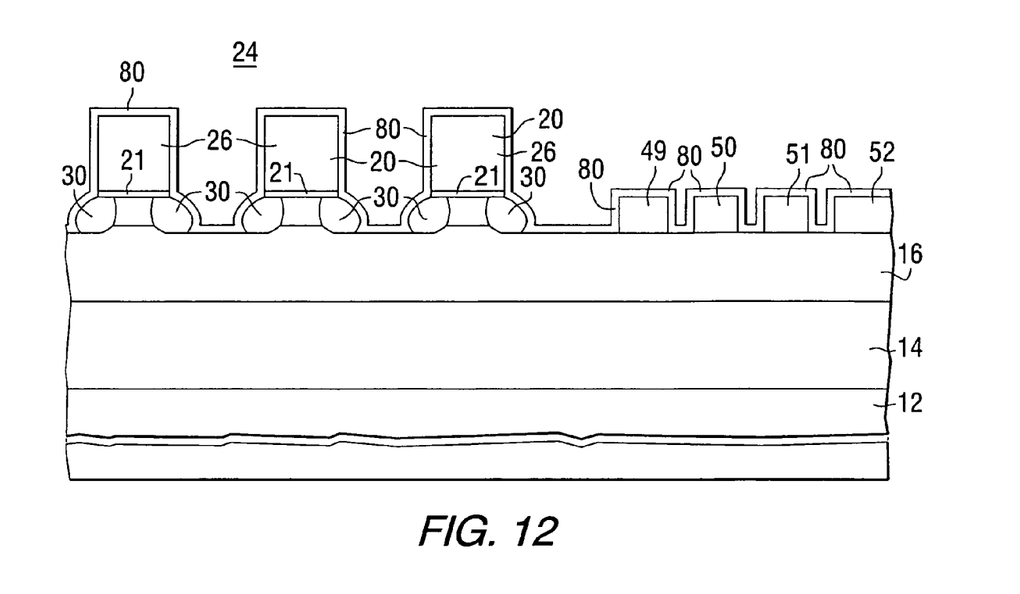
FIG. 12 illustrates the body with a spacer layer deposited after formation of skirts.
Figure 13:
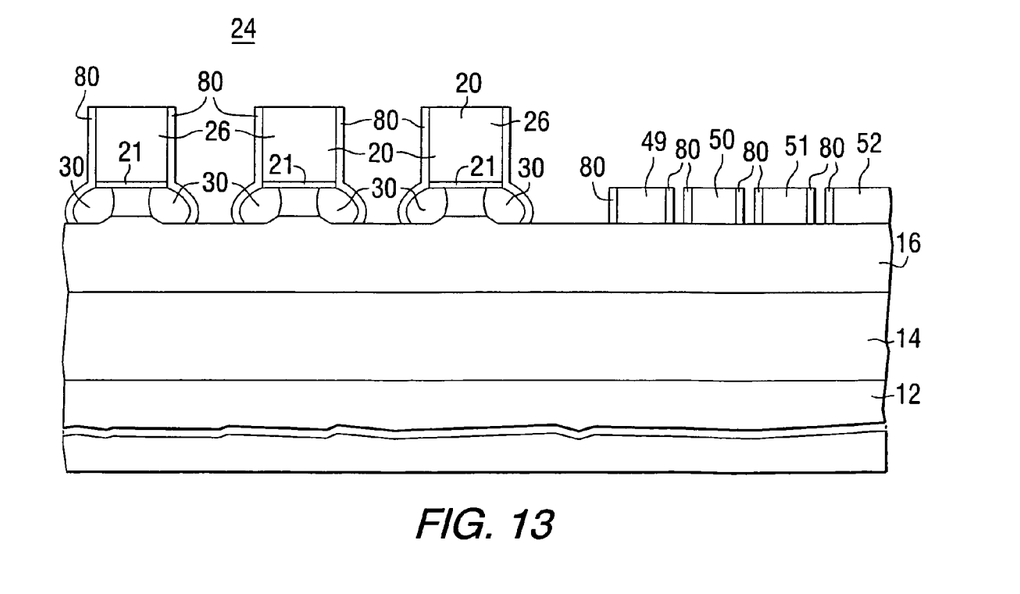
FIG. 13 illustrates the body after removal of the spacer layer of FIG. 12.

As an alternative, and as illustrated in FIG. 12, the TEOS spacer layer 80 may be applied after the formation of skirts 30. An RIE then removes the TEOS on top of the pillars 26 and on the surface of semiconductor layer 16, leaving the structure illustrated in FIG. 13, with the result that a gate will be narrower and therefore spaced further from a source than that illustrated in FIG. 9.

Accordingly a method for making a structure for use in a SIT has been described wherein the difficulties in making a Schottky type SIT have been eliminated. Further, the method does not require any masks for formation of gate regions, thus eliminating any misalignment problems. When formed using SiC, a resulting SIT may be used in high temperature and harsh environments such as may be encountered in radar, motor control for tank motors or hybrid cars, and space applications, to name a few.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of making a self aligned ion implanted gate structure for use in a static induction transistor, comprising the steps of:
   providing a semiconductor body having a plurality of epitaxially grown layers of a first conductivity type on a substrate, with a top one of said layers having a dopant concentration greater than that the next adjacent said layer;
   forming a thick oxide arrangement on the top of said top layer;
   depositing a mask having a plurality of metallic strips, on the top of said oxide arrangement, with said strips being parallel to one another;
   etching away said oxide arrangement which is between said strips down to said next adjacent layer to form an array of parallel pillars each having sidewalls and each having at the base thereof the remainder of said top layer after said etching;
   removing said mask;
   subjecting the resulting structure to an oxidation process to grow an oxide skirt around said base of each said pillar and to consume the edges of said remainder of said top layer;
   subjecting the resulting structure to an ion implantation to form gate regions of a second conductivity type between said oxide skirts;
   removing any remaining oxide to form a structure to which electrical contacts may be made to each said remainder of said top layer, each defining a source, to said gate regions and to said substrate forming a drain.

2. A method according to claim 1 which includes the step of:
   forming a plurality of concentric rings of an oxide material around said array, on said next adjacent layer; said ion implantation simultaneously forming concentric guard rings of said second conductivity in said next adjacent layer, between said concentric rings of an oxide material.

3. A method according to claim 1 which includes the steps of:
   forming said oxide arrangement by first thermally growing a relatively thin layer of oxide on said top layer, and depositing a relatively thick layer of oxide on said relatively thin layer of oxide.

4. A method according to claim 2 which includes the steps of:
   forming said plurality of concentric rings from silicon monoxide.

5. A method according to claim 1 which includes the steps of:
   providing said mask of chromium/nickel.

6. A method according to claim 2 which includes the steps of:
   covering said array with a photoresist;
   forming a plurality of concentric rings of photoresist;
   depositing said oxide material over all of said photoresist and between said concentric rings of photoresist;
   dissolving all of said photoresist to lift off said oxide material covering said photoresist, leaving said concentric rings of said oxide material.

7. A method according to claim 1 which includes the step of:
   providing said semiconductor body with a silicon carbide substrate and epitaxially grown silicon carbide layers.

8. A method according to claim 1 which includes the step of:
   providing said semiconductor body with three said layers on said substrate.

9. A method according to claim 1 which includes the step of:
   forming an oxide spacer layer on said sidewalls of said pillars, down to said next adjacent layer, either before or after the formation of said oxide skirt.

* * * * *